(12) United States Patent  
Wang et al.

(10) Patent No.: US 11,296,802 B1
(45) Date of Patent: Apr. 5, 2022

(54) WIRELESS CIRCUITRY WITH SELF-CALIBRATED HARMONIC REJECTION MIXERS

(71) Applicant: Apple Inc., Cupertino, CA (US)

(72) Inventors: Hongrui Wang, San Jose, CA (US); Abbas Komijani, Mountain View, CA (US); Saihua Lin, Santa Clara, CA (US); Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 5 days.

(21) Appl. No.: 17/031,753

(22) Filed: Sep. 24, 2020

(51) Int. Cl.
*H04B 17/21* (2015.01)
*H04B 17/345* (2015.01)
*H03B 5/18* (2006.01)

(52) U.S. Cl.
CPC .......... *H04B 17/21* (2015.01); *H03B 5/1829* (2013.01); *H04B 17/345* (2015.01); *H04B 2215/065* (2013.01)

(58) Field of Classification Search
CPC ...................................................... H04B 17/21
See application file for complete search history.

(56) References Cited

U.S. PATENT DOCUMENTS

| | | | |
|---|---|---|---|
| 5,697,092 A * | 12/1997 | Mourant | ................ H03D 7/125 455/323 |
| 6,999,747 B2 | 2/2006 | Su | |
| 7,130,604 B1 | 10/2006 | Wong et al. | |
| 7,164,899 B2 | 1/2007 | Davis | |
| 8,004,342 B2 | 8/2011 | Huang et al. | |
| 8,378,732 B2 * | 2/2013 | Kousai | ..................... G06G 7/12 327/355 |
| 10,129,059 B2 | 11/2018 | Chakraborty et al. | |
| 2006/0205377 A1 * | 9/2006 | Margairaz | ................ H04B 1/28 455/285 |
| 2014/0239978 A1 * | 8/2014 | Delzer | ................... G01R 27/28 324/619 |
| 2019/0222244 A1 * | 7/2019 | Floyd | ................... H04B 1/1036 |
| 2020/0091608 A1 | 3/2020 | Alpman et al. | |

OTHER PUBLICATIONS

Razavi, The Harmonic-Rejection Mixer, IEEE Solid-State Circuits Magazine, Nov. 16, 2018, pp. 10-14.

* cited by examiner

*Primary Examiner* — Hsinchun Liao
(74) *Attorney, Agent, or Firm* — Treyz Law Group, P.C.; Michael H. Lyons

(57) ABSTRACT

An electronic device may include a harmonic rejection mixer with a delay line, mixer array, and load. The delay line may generate LO phases. Each mixer in the array may have a first input that receives an LO phase and a second input coupled to an input switch and the first input of the next mixer circuit through an inter-mixer switch. The load may include a set of switches. In a transmit mode, the input switches and set of switches may be closed while the inter-mixer switches are open. In a self-calibration mode, the input switches and set of switches may be open while the inter-mixer switches are closed. A controller may sweep through phase codes for the programmable delay line while storing a digital output from the load. The controller may calibrate the phase code based on the digital output.

20 Claims, 8 Drawing Sheets

US 11,296,802 B1

WIRELESS CIRCUITRY WITH SELF-CALIBRATED HARMONIC REJECTION MIXERS

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry that includes one or more antennas. Wireless transmitter circuitry in the wireless communications circuitry generates radio-frequency signals using a local oscillator. The antennas transmit the radio-frequency signals.

It can be challenging to form satisfactory wireless transmitter circuitry for an electronic device. If care is not taken in the wireless transmitter circuitry design, harmonics of the local oscillator can undesirably degrade the radio-frequency signals transmitted by the antennas.

SUMMARY

An electronic device may include wireless circuitry for performing wireless communications. The wireless circuitry may include a baseband processor, a transmitter, and an antenna. The transmitter may include a local oscillator generator and a harmonic rejection mixer. The local oscillator generator may generate local oscillator (LO) waveforms. The harmonic rejection mixer may include a programmable delay line, a mixer array, an adjustable load, and a controller. The programmable delay line may generate a set of LO phases based on the LO waveforms. The harmonic rejection mixer may be operable in a transmit mode and in a calibration mode.

The mixer array may include a set of mixer circuits. Each mixer circuit may have a first input and a second input. The first input may receive a respective one of the LO phases. The second input may be coupled to an input path through an input switch. The second input may also be coupled to the first input of the next mixer circuit in the mixer array through an inter-mixer switch. The adjustable load may include a set of switches. In the transmit mode, the input switches in the mixer array may be closed, the inter-mixer switches in the mixer array may be open, and the set of switches in the adjustable load may be closed. The mixer array may generate radio-frequency signals on an output path based on input signals on the input path and the set of LO phases generated by the programmable delay line. The adjustable load may amplify the radio-frequency signals for transmission by an antenna.

In the calibration mode, the input switches in the mixer array may be open, the inter-mixer switches in the mixer array may be closed, and the set of switches in the adjustable load may be open. The mixer array may act as a phase detector and generate a direct current (DC) voltage on the output path based on the LO phases generated by the programmable delay line. The programable load may output the DC voltage. An analog-to-digital converter may generate a digital output based on the amplified DC voltage. The controller may store the digital output. The controller may sweep through different phase codes provided to the programmable delay line while gathering and storing the digital output. The controller may process the stored digital output to identify a zero crossing point of the DC voltage. The controller may identify a calibrated phase code associated with the zero crossing point and may provide the calibrated phase code to the programmable delay line. The programmable delay line may generate calibrated LO phases for the mixer array for use during subsequent radio-frequency signal transmission. This may allow the harmonic rejection mixer to cancel out harmonic interference from harmonic modes of the LO even as operating conditions for the device change over time.

An aspect of the disclosure provides an electronic device. The electronic device can have a mixer array. The mixer array can upconvert input signals on an input path to produce radio-frequency signals on an output path. The mixer array can have a first mixer circuit. The first mixer circuit can have a first input that receives a first local oscillator (LO) phase, a second input that receives the input signals, and a first output coupled to the output path. The mixer array can have a second mixer circuit. The second mixer circuit can have a third input that receives a second LO phase that is phase-delayed with respect to the first LO phase, a fourth input that receives the input signals, and a second output coupled to the output path. The mixer array can have an inter-mixer switch coupled between the second input of the first mixer circuit and the third input of the second mixer circuit.

An aspect of the disclosure provides a method for operating mixer circuitry. The method can include, with a programmable delay line, generating a first local oscillator (LO) phase, a second LO phase, and a third LO phase. The second LO phase can be phase-delayed with respect to the first LO phase. The third LO phase can be phase-delayed with respect to the second LO phase. The method can include, with a first mixer circuit in a mixer array, mixing the first LO phase with the second LO phase. The method can include, with a second mixer circuit in the mixer array, mixing the second LO phase with the third LO phase. The method can include, with the mixer array, outputting a direct current (DC) voltage onto an output path. The DC voltage can be produced by at least the first and second mixer circuits. The method can include, with an adjustable load coupled to the output path, amplifying the DC voltage to generate an amplified DC voltage. The method can include, with an analog-to-digital converter (ADC) coupled to the output path, generating a digital output based on the amplified DC voltage. The method can include, with a controller coupled to the ADC, adjusting the first, second, and third LO phases based on the digital output.

An aspect of the disclosure provides an electronic device. The electronic device can have an input path that receives input signals. The electronic device can have first and second output lines. The electronic device can have a programmable delay line that generates a set of local oscillator (LO) phases. The electronic device can have a mixer array coupled between the input path and the first and second output lines. The mixer array can generate radio-frequency signals on the first and second output lines based on the input signals and the set of LO phases. The electronic device can have an adjustable load coupled to the first and second output lines.

DETAILED DESCRIPTION

Figure 1:
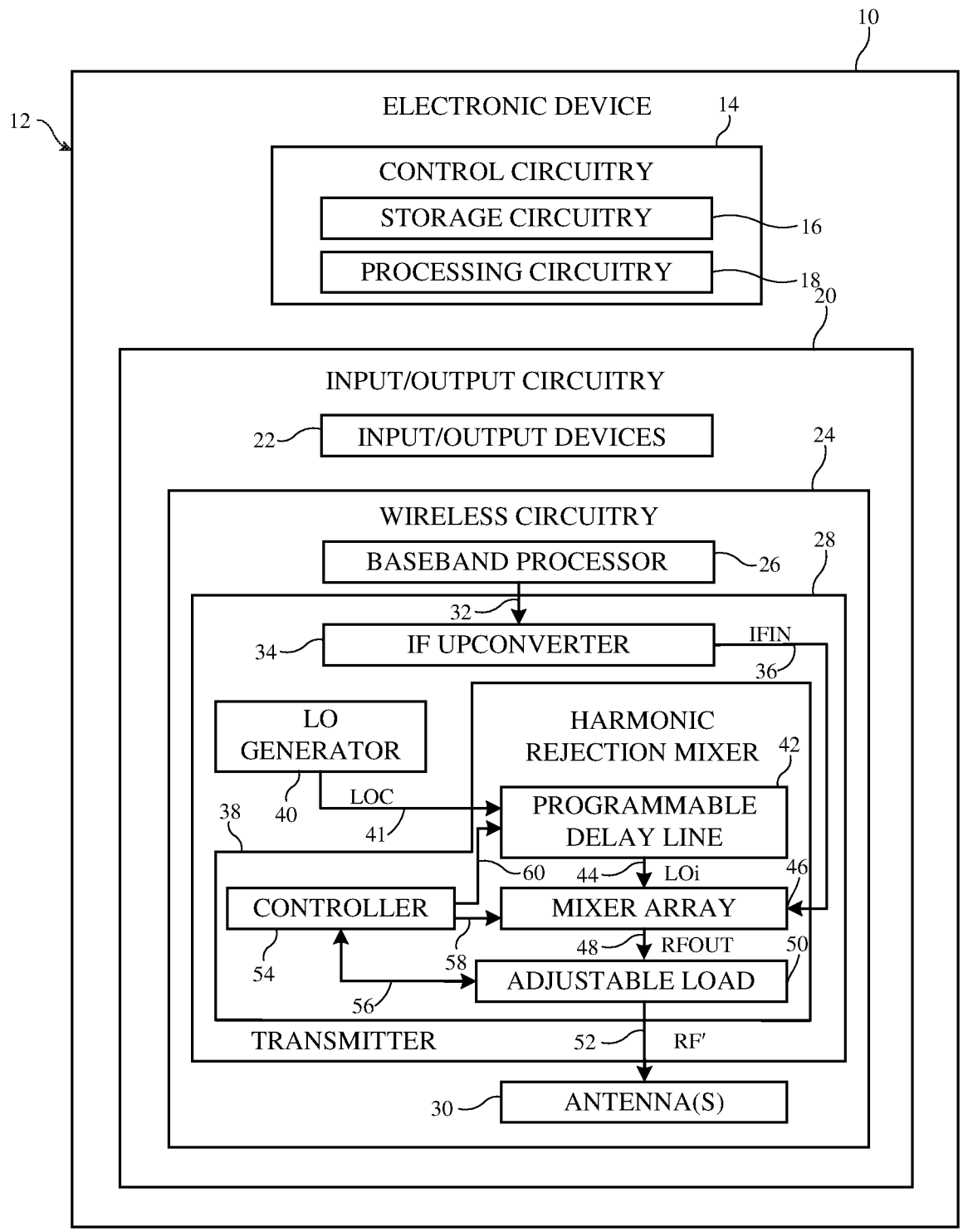
FIG. 1 is a schematic diagram of an illustrative electronic device having a wireless transmitter with a harmonic rejection mixer in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include a baseband processor such as baseband processor 26, radio-frequency (RF) transmitter circuitry such as transmitter 28, and one or more antennas 30. Baseband processor 26 may be coupled to transmitter 28 over baseband path 32. Transmitter 28 may be coupled to antenna(s) 30 over radio-frequency transmission line path 52. If desired, radio-frequency front end circuitry may be interposed on radio-frequency transmission line path 52.

In the example of FIG. 1, wireless circuitry 24 is illustrated as including only a single baseband processor 26 and a single transmitter 28 for the sake of clarity. In general, wireless circuitry 24 may include any desired number of baseband processors 26, any desired number of transmitters 28, and any desired number of antennas 30. Each antenna may be coupled to transmitter 28 over a respective radio-frequency transmission line path, for example. Transmitter 28 may transmit radio-frequency signals RF' using antenna(s) 30. If desired, wireless circuitry 24 may also include one or more radio-frequency receivers for receiving radio-frequency signals using antenna(s) 30 (e.g., the radio-frequency receiver and transmitter 28 may collectively form a radio-frequency transceiver for wireless circuitry 24).

Radio-frequency transmission line path 52 may be coupled to antenna feed(s) on antenna(s) 30. Each antenna feed may, for example, include a positive antenna feed terminal and a ground antenna feed terminal. Radio-frequency transmission line path 52 may have a positive transmission line signal path such that is coupled to the positive antenna feed terminal. Radio-frequency transmission line path 52 may have a ground transmission line signal path that is coupled to the ground antenna feed terminal. This example is merely illustrative and, in general, antenna(s) 30 may be fed using any desired antenna feeding scheme. If desired, each antenna 30 may have multiple antenna feeds that are coupled to one or more radio-frequency transmission line paths 52.

Radio-frequency transmission line path 52 may include transmission lines that are used to route radio-frequency antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 52 may be integrated into rigid and/or flexible printed circuit boards.

Radio-frequency signals RF' may be produced by transmitter 28 at a carrier frequency. The carrier frequency may lie within a corresponding frequency band (sometimes referred to herein as a communications band or simply as a "band"). The frequency bands handled by transmitter 28 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, and/or any other desired frequency bands of interest.

Antenna(s) 30 may be formed using any desired antenna structures. For example, antenna(s) 30 may include an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and other circuitry may be interposed within radio-frequency transmission line path 52, may be incorporated into front end circuitry for antenna(s) 30, and/or may be incorporated into antenna(s) 30 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna(s) 30 over time.

In radio-frequency transmitters, radio-frequency signals may be constructed using local oscillator (LO) waveforms. For example, as shown in FIG. 1, transmitter 28 may include LO generator circuitry such as LO generator 40. LO generator 40 may produce local oscillator waveforms LOC on path 41 (sometimes referred to herein as local oscillator path 41 or LO path 41). In performing wireless transmission, baseband processor 26 may provide baseband signals to transmitter 28 over baseband path 32. Transmitter 28 may include mixer circuitry that up-converts the baseband signals to radio frequencies based on the local oscillator waveforms LOC output by LO generator 40.

Spectral purity is important for signal quality and integrity in the mixer circuitry of transmitter 28. However, hard-switching mixers are rich with odd-order harmonics of the local oscillator. If care is not taken, these odd-order harmonics can generate spurious signals or tones that cause error vector magnitude (EVM) degradation, blocker desense, and/or spurious emission mask violations in transmitter 28. For example, if the frequency of the local oscillator is close to the frequency of the signals input to the mixer circuitry for upconversion, the strong third-order harmonic of the local oscillator would create an unwanted signal at a frequency equal to three-times the frequency of the local oscillator minus the frequency of the signals input to the mixer circuitry for upconversion. This frequency is close to the desired frequency output by the mixer circuitry (e.g., the frequency of the local oscillator plus the frequency of the signals input to the mixer circuitry for upconversion). This unwanted signal would degrade the EVM of transmitter 28 if it overlaps with the in-band signal and would violate the emission mask if it lies out-of-band. In arrangements where a direct up-conversion mixer is used, the mixer would exhibit counter third-order intermodulation (CIM3) issues.

The mixer circuitry in transmitter 28 may perform up-conversion using the fundamental mode of the local oscillator (e.g., as identified by waveforms LOC) or, in another suitable arrangement, may perform up-conversion using the third-order harmonic mode of the local oscillator. In these scenarios, a frequency tripler may be used in LO generator 40. The frequency tripler includes a voltage controlled oscillator (VCO) that generates a lower frequency local oscillator that is tripled to a desired frequency (e.g., a frequency that is three-times the fundamental mode frequency of the lower frequency local oscillator). In this case, the third-order harmonic of the local oscillator (e.g., as identified by waveforms LOC) may be used by the mixer circuitry rather than the fundamental mode of the local oscillator.

In order to mitigate EVM degradation and emission mask violation in transmitter 28 due to harmonics of the local oscillator, the mixer circuitry in transmitter 28 may include a harmonic rejection mixer such as harmonic rejection mixer 38. In one suitable arrangement that is described herein as an example, harmonic rejection mixer 38 may up-convert intermediate frequency (IF) signals IFIN to radio-frequency signals (e.g., radio-frequency signals RF' for transmission by antenna(s) 30). This is merely illustrative and, if desired, harmonic rejection mixer 38 may up-convert baseband signals or signals at other frequencies to radio frequencies.

As shown in FIG. 1, transmitter 28 may include IF upconverter circuitry such as IF up-converter 34. IF upconverter 34 may upconvert the baseband signals received over baseband path 32 into corresponding IF signals IFIN. IF signals IFIN may be at frequencies between the frequency of radio-frequency signals RF' and the baseband frequency of the baseband signals. IF upconverter 34 may provide IF signals IFIN to harmonic rejection mixer 38 over signal path 36. Signal path 36 may sometimes be referred to herein as IF path 36.

Harmonic rejection mixer 38 may include local oscillator phase generation circuitry such as programmable delay line 42, may include an array of mixers such as mixer array 46, may include adjustable load circuitry such as adjustable load 50, and may include control circuitry such as controller 54. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26, some or all of controller 54, and/or other portions of transmitter 28 may form a part of control circuitry 14.

Controller 54 may be coupled to programmable delay line 42 over control path 60. Controller 54 may provide control signals to programmable delay line 42 over control path 60 that control the operation of programmable delay line 42. Controller 54 may be coupled to mixer array 46 over control path 58. Controller 54 may provide control signals to mixer array 46 over control path 58 that control the operation of mixer array 46. Controller 54 may be coupled to adjustable load 50 over control path 56. Controller 54 may provide control signals to adjustable load 50 over control path 56 that control the operation of adjustable load 50. Adjustable load 50 may include analog-to-digital converter circuitry that provides digital signals to controller 54 over control path 56 (e.g., for use in calibrating harmonic rejection mixer 38). Adjustable load 50 may be coupled to antenna(s) 30 over radio-frequency transmission line path 52.

Harmonic rejection mixer 38 is a multi-phase mixer that performs upconversion on IF signals IFIN using multiple phases of the local oscillator. For example, programmable delay line 42 may receive waveforms LOC from LO generator 40 over LO path 41. Programmable delay line 42 may produce N LO phases LOi based on waveforms LOC (e.g., a first LO phase LO0, a second LO phase LO1, a third LO phase LO2, an Nth LO phase LON, etc.). Programable delay line 42 may provide LO phases LOi to mixer array 46 over phase paths 44.

Mixer array 46 may receive IF signals IFIN from IF upconverter 34 over IF path 36. Mixer array 46 may include multiple mixer circuits arranged in an array pattern (e.g., as a Gilbert cell). Mixer array 46 may produce output signals RFOUT on output path 48 based at least on the LO phases LOi received over phase paths 44. For example, when transmitter 28 is transmitting radio-frequency signals RF', mixer array 46 may upconvert IF signals IFIN using LO phases LOi to produce output signals RFOUT at radio frequencies. Adjustable load 50 may amplify the output signals RFOUT on output path 48 and may output the output signals to other circuitry in transmitter 28 for transmission by antenna(s) 30. Power amplifier circuitry, digital-to-analog converter (DAC) circuitry, and/or other circuitry in transmitter 28 (not shown in FIG. 1 for the sake of clarity) may operate on output signals RFOUT (e.g., at radio frequencies) to produce the radio-frequency signals RF' that are transmitted by antenna(s) 30.

In general, the LO phases LOi used by mixer array 46 need to be arranged in a way such that the third-order harmonic of the local oscillator can be canceled out. However, if care is not taken, phase accuracy can be difficult to maintain over channel frequency, operating temperature, and process variations, particularly for transmission at centimeter/millimeter wave frequencies. Closed loop solutions to these issues such as delay lock loop (DLL) solutions can work to combat variations but also exhibit excessive phase noise. In order to mitigate these issues regardless of variations in channel frequency, operating temperature, and process, harmonic rejection mixer 38 may perform open loop self-calibration operations.

The self-calibration operations may update the settings of programmable delay line 42 over time so that the optimal local oscillator phases LOi are provided to mixer array 46 as device operating conditions change over time. Harmonic rejection mixer 38 may therefore be operable in two operating modes: a normal transmit mode in which harmonic rejection mixer 38 produces radio-frequency signals RF' for transmission by antenna(s) 30 and a calibration mode in which harmonic rejection mixer 38 self-calibrates the settings of programable delay line 42. Performing self-calibration in the calibration mode may ensure that, when harmonic rejection mixer 38 is placed back into the transmit mode, radio-frequency signals RF' are transmitted without undesirable EVM degradation or emission mask violation.

Figure 2:
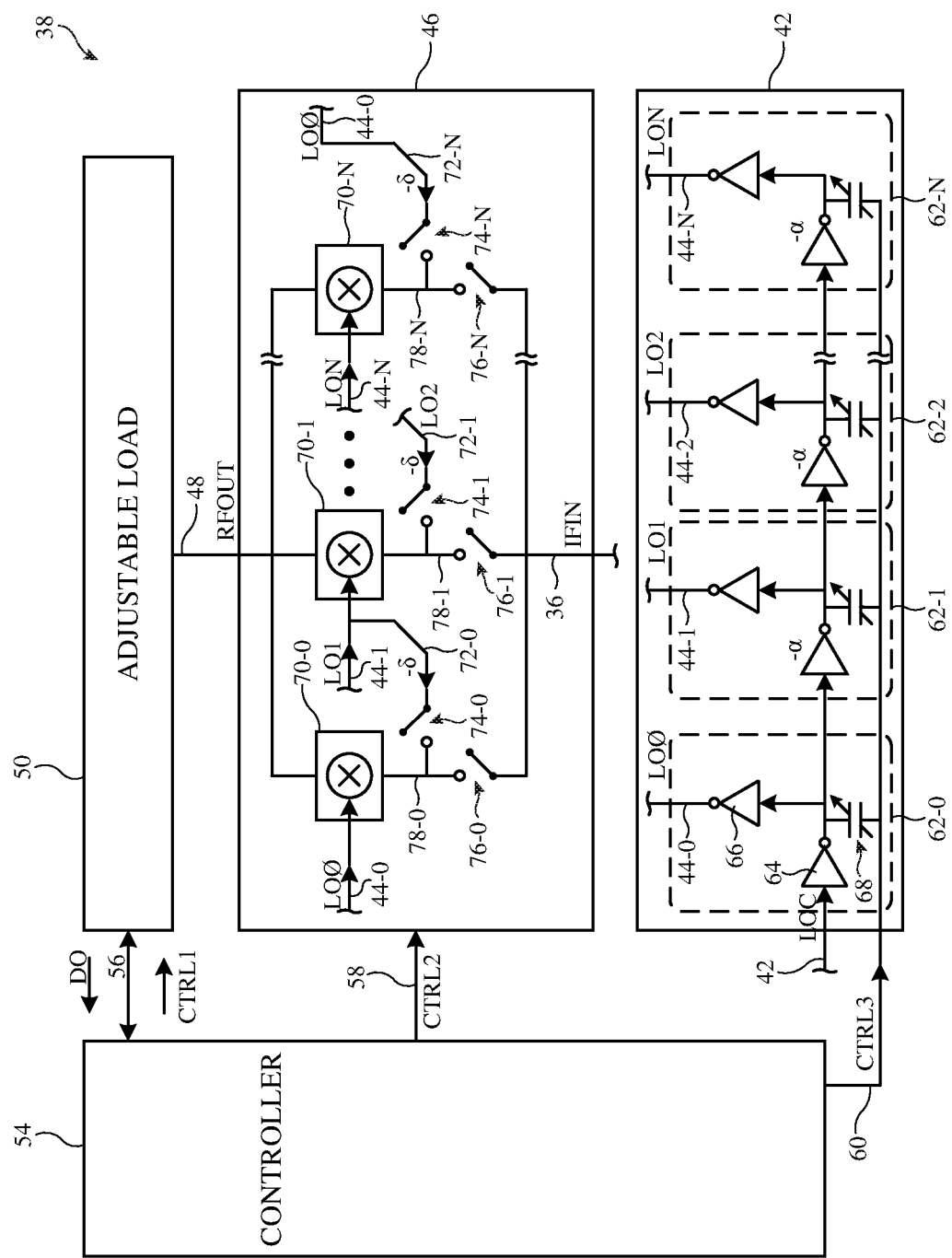
FIG. 2 is a circuit diagram of an illustrative harmonic rejection mixer in accordance with some embodiments.

FIG. 2 is a circuit diagram of harmonic rejection mixer 38. In the example of FIG. 2, harmonic rejection mixer 38 performs upconversion using N phases of the local oscillator. N may be any desired integer (e.g., N may be equal to two, three, four, five, six, seven, eight, more than eight, etc.). As shown in FIG. 2, harmonic rejection mixer 38 may include controller 54, adjustable load 50, mixer array 46, and programmable delay line 42. Controller 54 may be coupled to adjustable load 50 over control path 56 and may be coupled to mixer array 46 over control path 58. Controller 54 may provide control signals CTRL1 to adjustable load 50 via control path 56 and may provide control signals CTRL2 to mixer array 46 via control path 58. Control signals CTRL1 may, for example, reconfigure switches in adjustable load 50 as harmonic rejection mixer 38 transitions between the transmit mode and the calibration mode. Similarly, control signals CTRL2 may reconfigure switches in mixer array 46 as harmonic rejection mixer 38 transitions between the transmit mode and the calibration mode.

Controller 54 may be coupled to programmable delay line 42 over control path 60. Controller 54 may provide control signals CTRL3 to programmable delay line 42 via control path 60. Control signals CTRL3 may, for example, identify phase tuning settings such as a phase code for programmable delay line 42. Programmable delay line 42 may receive local oscillator waveforms LOC from LO generator 40 (FIG. 1) over LO path 41. Programmable delay line 42 may generate N LO phases LOi based on waveforms LOC and may output LO phases LOi onto phase paths 44 (e.g., programmable delay line 42 may output a first LO phase LO0 on a first phase path 44-0, may output a second LO phase LO1 on second phase path 44-1, may output a third LO phase LO2 on third phase path 44-2, may output an Nth LO phase LON on Nth phase path 44-N, etc.).

Programmable delay line 42 may include N cascaded delay cells 62 (e.g., a first delay cell 62-0, a second delay cell 62-1, a third delay cell 62-2, an Nth delay cell 62-N, etc.). Each delay cell 62 may include a first inverter 64 (e.g., a logic NOT gate), a second inverter 66 (e.g., a logic NOT gate), and an adjustable capacitance 68. The output of first inverter 64 may be coupled to the input of second inverter 66 and to the input of the first inverter 64 of the next delay cell 62 of programmable delay line 42. The output of second inverter 66 may be coupled to a respective phase path 44. The input of first inverter 64 may be coupled to the output of the first inverter 64 and the input of the second inverter 66 of the previous delay cell 62 of programmable delay line 42. Adjustable capacitance 68 may be coupled between the output of first inverter 64, the input of the second inverter 66, and control path 60. The output of the first inverter in Nth delay cell 62-N may be coupled to the input of the second inverter in Nth delay cell 62-N without being coupled to the input of any other delay cells 62 (e.g., because programmable delay line 42 includes only N delay cells 62). The input of the first inverter 64 in first delay cell 62-0 may be coupled to LO path 41.

First delay cell 62 may output first LO phase LO0 on phase path 44-0 based on the waveforms LOC received over LO path 41. The inverters in each subsequent delay cell 62 may apply an equally spaced phase delay α to the LOC waveforms received from the output of the previous delay cell 62 to produce the remaining (N−1) LO phases LOi on phase paths 44-1 through 44-N (e.g., second LO phase LO1 may be at a phase that is −α with respect to the phase of first LO phase LO0, third LO phase LO2 may be at a phase that is −α with respect to the phase of second LO phase LO1 and that is −2α with respect to the phase of first LO phase LO0, etc.).

Adjustable capacitances 68 may be formed from banks of discrete capacitors or varactors, as examples. The phase code identified by control signal CTRL3 may control adjustable capacitances 68 to exhibit a selected capacitance. When harmonic rejection mixer 38 is operating in the calibration mode, control circuitry 54 may sweep through different phase codes in control signal CTRL3 to adjust the selected capacitance of adjustable capacitances 68. This change in the selected capacitance may serve to tweak the LO phases LOi produced by programmable delay line 42 so optimal LO phases LOi can be provided to mixer array 46 even as operating conditions change over time.

As shown in FIG. 2, mixer array 46 may include N mixer circuits 70 (e.g., a first mixer circuit 70-0, a second mixer circuit 70-1, an Nth mixer circuit 70-N, etc.). Mixer circuits 70 may, if desired, be arranged in a Gilbert cell configuration. Each of the N mixer circuits 70 may be coupled in parallel between IF path 36 and output path 48. Adjustable load 50 may also be coupled to output path 48. Mixer array 46 may have an IF input port coupled to IF path 36, an output port coupled to output path 48, and N LO phase input ports coupled to phase paths 44. The gain coefficient of each mixer circuit 70 may be given by the sizing, biasing, and/or polarity swapping of the circuitry within the mixer circuit, for example.

Each mixer circuit 70 in mixer array 46 may have a first input coupled to a respective input path 78 and a second input coupled to a respective phase path 44 (e.g., mixer circuit 70-0 may have a first input coupled to input path 78-0 and a second input coupled to phase path 44-0, mixer circuit 70-1 may have a first input coupled to input path 78-1 and a second input coupled to phase path 44-1, mixer circuit 70-N may have a first input coupled to input path 78-N and a second input coupled to phase path 44-N, etc.). Each mixer circuit 70 may receive a respective LO phase LOi over the corresponding phase path 44 (e.g., mixer circuit 70-0 may receive the LO phase LO0 produced by delay cell 62-0 over phase path 44-0, mixer circuit 70-1 may receive the LO phase LO1 produced by delay cell 62-1 over phase path 44-1, mixer circuit 70-N may receive the LO phase LON produced by delay cell 62-N over phase path 44-N, etc.). Each input path 78 may be coupled to IF path 36 through a respective IF switch 76 (e.g., IF switch 76-0 may couple IF path 36 to input path 78-0, IF switch 76-1 may couple IF path 36 to input path 78-1, IF switch 76-N may couple IF path 36 to input path 78-N, etc.).

The input path 78 for each mixer circuit 70 may be coupled to the phase path 44 of the next mixer circuit 70 in mixer array 46 over a respective inter-mixer path 72. A respective inter-mixer switch 74 may be interposed on each inter-mixer path 72. For example, as shown in FIG. 2, input path 78-0 for mixer circuit 70-0 may be coupled to the phase path 44-1 for mixer circuit 70-1 via inter-mixer path 72-0 and inter-mixer switch 74-0, input path 78-1 for mixer circuit 70-1 may be coupled to the phase path for the next mixer circuit in mixer array 46 via inter-mixer path 72-1 and inter-mixer switch 74-1, input path 78-N for mixer circuit 70-N may be coupled to the phase path 44-0 for mixer circuit 70-0 via inter-mixer path 72-N and inter-mixer switch 74-N, etc.

Controller 54 may control the state of the switches 76 and 74 in mixer array 46 (e.g., using control signals CTRL2) based on whether harmonic rejection mixer 38 is being operated in the transmit mode or the calibration mode. In the transmit mode, controller 54 may open inter-mixer switches 74 while closing IF switches 76. Mixer circuits 70 will thereby upconvert IF signals IFIN to produce output signals RFOUT at radio-frequencies (e.g., using the LO phases LOi received from programmable delay line 42). In the transmit mode, controller 54 may also control adjustable load 50 (e.g., using control signals CTRL1) to amplify output signals RFOUT for transmission to antenna(s) 30 (e.g., as radio-frequency signals RF' of FIG. 1).

In the calibration mode, controller 54 may open IF switches 76 while closing inter-mixer switches 74. This may configure mixer array 46 to form a phase detector in which the LO phase from the next mixer circuit 70 in mixer array 46 is provided to the first input of each mixer circuit 70. Each inter-mixer path 72 may have a path delay that produces a corresponding phase delay δ, which is output by mixer array 46 at output path 48 (e.g., output signals RFOUT may be a DC voltage that identifies phase delay δ in the calibration mode). Phase delay δ may sometimes be referred to herein as routing phase delay δ. Adjustable load 50 may generate digital output DO based on the DC voltage output by mixer array 46. Controller 54 may process digital output DO to calibrate the LO phase settings of programmable delay line 42 (e.g., to provide programmable delay line 42 with a phase code in control signals CTRL3 that produces LO phases LOi that optimize performance by the transmitter for the current operating conditions).

Figure 3:
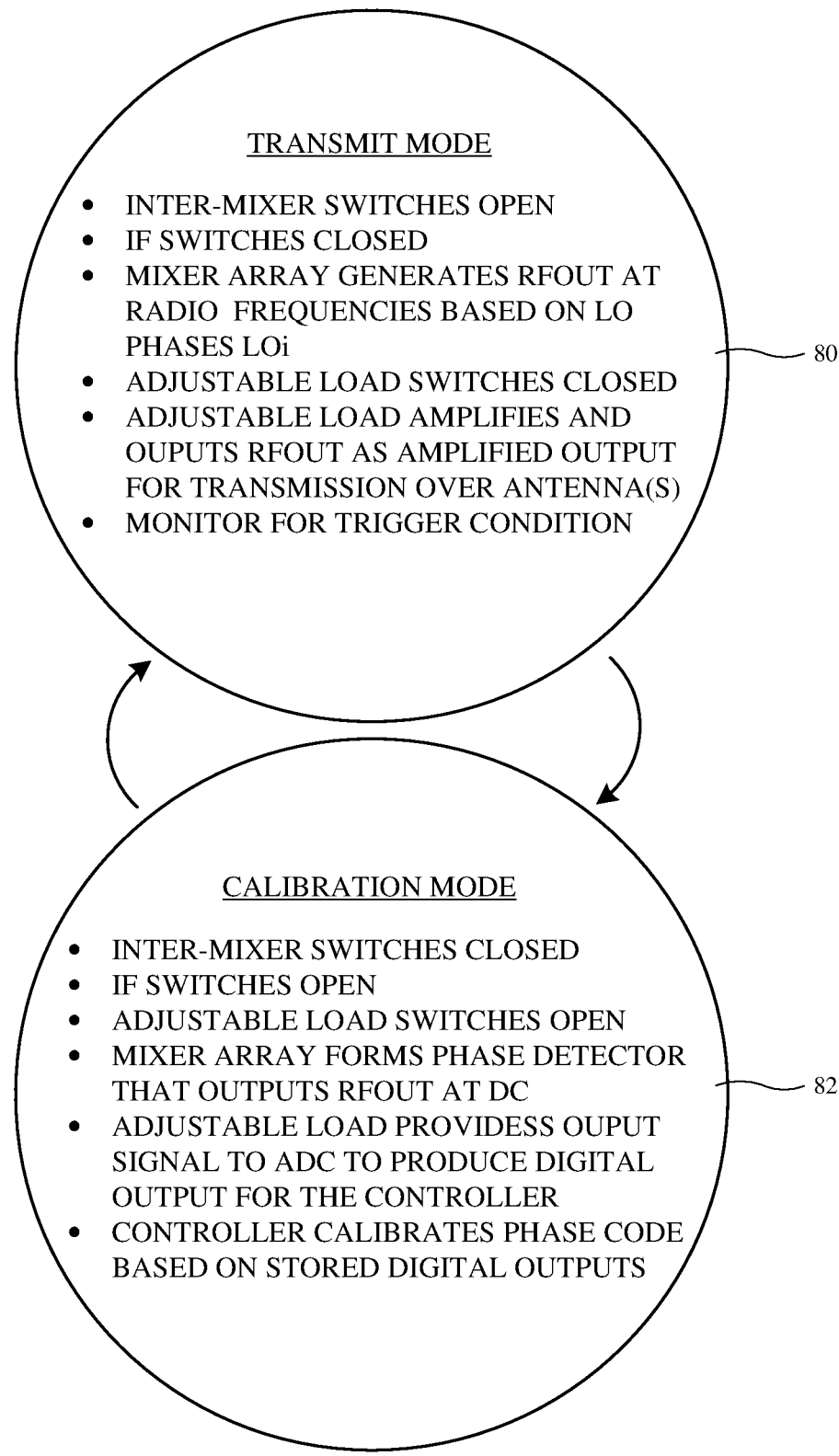
FIG. 3 is a state diagram showing how an illustrative harmonic rejection mixer may be operable in a transmit mode and in a calibration mode in accordance with some embodiments.

FIG. 3 is a state diagram illustrating how harmonic rejection mixer 38 may toggle between a transmit mode 80 and a calibration mode 82. When harmonic rejection mixer 38 is operated in transmit mode 80 (sometimes referred to herein as normal mode 80), harmonic rejection mixer 38 upconverts IF signals IFIN to radio frequencies and transmitter 28 transmits the corresponding radio-frequency signals RF' to antenna(s) for transmission (FIG. 1).

In transmit mode 80, the inter-mixer switches 74 in mixer array 46 are open. The IF switches 76 in mixer array 46 are closed. Programmable delay line 42 generates LO phases LOi for mixer array 46. Mixer array 46 generates output signals RFOUT at radio frequencies (on output path 48) by upconverting the IF signals IFIN on IF path 36 using LO phases LOi. Switches in adjustable load 50 may be closed in transmit mode 80. Adjustable load 50 amplifies output signals RFOUT and outputs the amplified signals onto radio-frequency transmission line path 52 for transmission by antenna(s) 30.

Controller 54 may monitor for a trigger condition that would trigger a transition from transmit mode 80 to calibration mode 82. The trigger condition may occur when wireless performance metric data associated with transmitter 28 reaches a curtained predetermined threshold (e.g., when gathered EVM data exceeds a threshold value, when spectral violations occur, etc.), may occur after a predetermined amount of time, may occur when the frequency used to transmit radio-frequency signals RF' changes (e.g., when transmitter 28 changes the frequency channel for transmission), may occur when temperature sensor data gathered by controller 54 indicates that device 10 has undergone a predetermined change in temperature, etc.

When harmonic rejection mixer 38 is operated in calibration mode 82 (sometimes referred to herein as self-calibration mode 82), harmonic rejection mixer 38 forms a phase detector that provides digital output DO to controller 54 based on local oscillator phases LOi. For example, in calibration mode 82, inter-mixer switches 74 may be closed. IF switches 76 may be open. The switches in adjustable load 50 may be open. Mixer array 46 may form a phase detector that generates output signals RFOUT as a DC voltage on output path 48. The DC voltage may identify the routing phase delay δ associated with inter-mixer paths 72 and/or the phase delay α produced by delay cells 62. Adjustable load 50 may provide the DC voltage to an analog-to-digital converter (ADC). The ADC may generate digital output DO based on the DC voltage (e.g., a digital signal that identifies routing phase delay δ and/or phase delay α). Controller 54 may receive digital output DO. Controller 54 may calibrate harmonic rejection mixer 38 based on the received digital output DO. For example, controller 54 may sweep through different phase codes provided to programmable delay line 42. Controller 54 may use the digital output DO produced during each step of the sweep to identify a setting for programmable delay line 42 (e.g., a phase code) that optimizes performance. The phase code may correspond to a zero crossing point of the DC voltage. Once the optimal setting for programmable delay line 42, controller 54 may place harmonic rejection mixer 38 back into transmit mode 80. Harmonic rejection mixer 38 may then produce output signals RFOUT at radio frequencies for transmission (e.g., using LO phases LOi produced by the optimal setting for programmable delay line 42 as identified in calibration mode 82).

Figure 4:
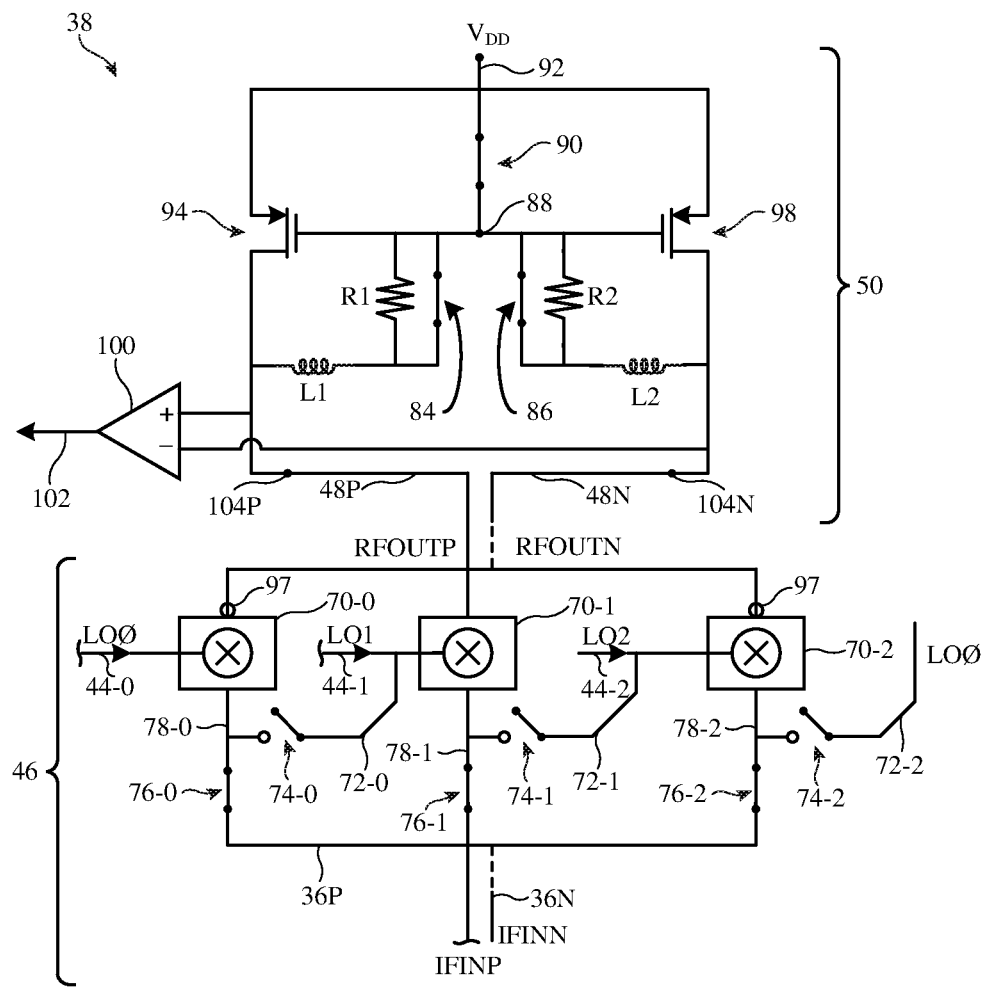
FIG. 4 is a circuit diagram showing the harmonic rejection mixer of FIG. 2 operated in the transmit mode in accordance with some embodiments.

FIG. 4 is a circuit diagram of harmonic rejection mixer 38 while operated in transmit mode 80. In the example of FIG. 4, controller 54 and programmable delay line 42 are not shown for the sake of clarity. In this example, there are N=3 mixer circuits 70 in mixer array 46 (e.g., a first mixer circuit 70-0, a second mixer circuit 70-1, and a third mixer circuit 70-2). Similarly, there are N=3 LO phases LOi that are produced by programmable delay line 42 (e.g., programmable delay line 42 may have a first delay cell 62-0 that produces a first LO phase LO0, a second delay cell 62-1 that produces a second LO phase LO1, and a third delay cell 62-2 that produces a third LO phase LO2). This is merely illustrative and, in general, N may be any desired integer.

In the example of FIG. 4, IF signals IFIN and output signals RFOUT are differential signals. Output signals RFOUT therefore include differential signal pair RFOUTP/RFOUTN. Output path 48 (FIG. 2) includes differential output lines 48P/48N (e.g., where differential output line 48P conveys differential output signal RFOUTP and differential output line 48N conveys differential output signal RFOUTN). Similarly, IF signals IFIN include differential signal pair IFINP/IFINN. IF path 36 (FIG. 2) includes differential IF lines 36P/36N (e.g., where differential IF line 36P conveys differential IF signals IFINP and differential IF line 36N conveys differential IF signals IFINN). FIG. 4 illustrates the operation of mixer array 46 only on differential IF signals IFINP for the sake of clarity. Similar operations may also be performed on differential IF signals IFINN. This example is merely illustrative and, in another suitable arrangement, IF signals IFIN and output signals RFOUT may be single-ended signals.

As shown in FIG. 4, IF switches 76-0, 76-1, and 76-2 are closed in transmit mode 80. At the same time, inter-mixer switches 74-0, 74-1, and 74-2 are open. Controller 54 may control the states of inter-mixer switches 74 and IF switches 76 using control signals CTRL2 provided over control path 58 (FIG. 2). Mixer circuit 70-0 may upconvert the IF signals IFIN that pass through IF switch 76-0 using LO phase LO0. Mixer circuit 70-1 may upconvert the IF signals IFIN that pass through IF switch 76-1 using LO phase LO1. Mixer circuit 70-2 may upconvert the IF signals IFIN that pass through IF switch 76-2 using LO phase LO2. Mixer circuits 70-0, 70-1, and 70-3 may output corresponding output signals RFOUT (e.g., differential signal pair RFOUTP/RFOUTN) on output path 48. Output signals RFOUT may be at radio frequencies (e.g., frequencies within the frequency band(s) of operation of antenna(s) 30 of FIG. 1).

In order to cancel out the third-order harmonic of the local oscillator, mixer circuit 70-1 may be twice the size of mixer circuit 70-0 and may be twice the size of mixer circuit 70-2 (e.g., the three mixer circuits in mixer array 46 may have a 1:2:1 size ratio). If, for example, LO phase LO0 has a phase of zero degrees, LO phase LO1 may have a phase of −α (e.g., as imparted by the first and second delay cells in programmable delay line 42) and LO phase LO2 may have a phase of −2α (e.g., as imparted by the first, second, and third delay cells in programable delay line 42). In this example, a may be 60, 120, or 240 degrees. In scenarios where α=120 or 240, the output signals produced by mixer circuit 70-0 and mixer circuit 70-2 may be inverted (e.g., at outputs 97 coupled to output path 48). If desired, this phase inverting may be performed by swapping the RFOUTP and RFOUTN connections in the mixer circuit (in examples where the mixer circuit is a differential circuit).

Adjustable load 50 may include transistor 94 (e.g., a PMOS transistor), transistor 98 (e.g., a PMOS transistor), a first inductor L1, a second L2, a first resistor R1, a second resistor R2, a power supply terminal 92, a first switch 90, a second switch 84, and a third switch 86. The drain terminal of transistor 94 may be coupled to differential output line 48P. The source terminal of transistor 94 may be coupled to power supply terminal 92. The gate terminal of transistor 94 may be coupled to circuit node 88. The drain terminal of transistor 98 may be coupled to differential output line 48N. The source terminal of transistor 98 may be coupled to power supply terminal 92. The gate terminal of transistor 98 may be coupled to circuit node 88. Switch 90 may be coupled between circuit node 88 and power supply terminal 92. Power supply terminal 92 may receive a power supply voltage such as power supply voltage $V_{DD}$.

Inductor L1 and switch 84 may be coupled in series between differential output line 48P and circuit node 88. Resistor R1 may be coupled in parallel with switch 84 between inductor L1 and circuit node 88. Inductor L2 and switch 86 may be coupled in series between differential output line 48N and circuit node 88. Resistor R2 may be coupled in parallel with switch 86 between inductor L2 and circuit node 88. An ADC such as comparator 100 may have a first input terminal coupled to differential output line 48P and a second input terminal coupled to differential output line 48N. Comparator 100 may have an output terminal 102 that is coupled to controller 54 over control path 56 (FIG. 2). Comparator 100 may be unused during transmit mode 80.

In transmit mode 80, switches 84, 86, and 90 are closed. Controller 54 may control the states of switches 84, 86, and 90 using control signals CTRL1 provided over control path 56 (FIG. 2). Circuit node 88 (e.g., a center tap of adjustable load 50) may be shorted to power supply voltage $V_{DD}$ through switch 90. There may be no or negligible current passing between the source and drain terminals of transistors 98 and 94. Current may bypass resistors R1 and R2 through switches 84 and 86. This may configure adjustable load 50 to form a differential inductor at the radio frequencies of output signals RFOUT (e.g., a differential inductor having an inductance given by inductors L1 and L2).

The differential inductor and a parasitic capacitance associated with mixer array 46 may form a resonant circuit. The resonant circuit may resonate at the radio frequencies of output signals RFOUT and may serve to convert current from mixer array 46 into a corresponding voltage. This voltage may form across differential output lines 48P and 48N and may be passed to additional circuitry in transmitter 28 for transmission by antenna(s) 30. The resonant circuit may also serve to amplify the voltage. Radio-frequency transmission line path 52 or other circuitry in transmitter 28 (FIG. 1) may be coupled to output terminals 104P and 104N on differential output lines 48P and 48N and may receive the amplified voltage produced by adjustable load 50 over output terminals 104P and 104N (e.g., for transmission as corresponding radio-frequency signals RF' of FIG. 4).

Figure 5:
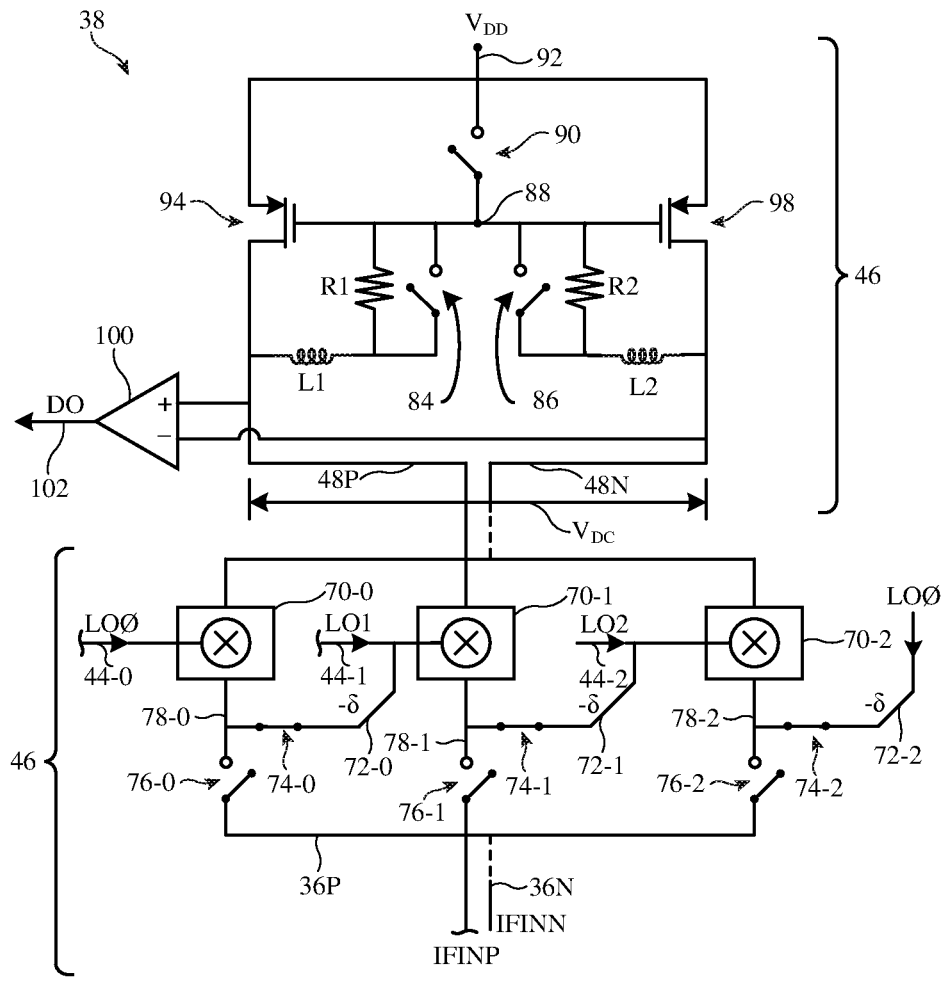
FIG. 5 is a circuit diagram showing the harmonic rejection mixer of FIG. 2 operated in the calibration mode in accordance with some embodiments.

FIG. 5 is a circuit diagram of harmonic rejection mixer 38 while operated in calibration mode 82 of FIG. 3. As shown in FIG. 5, in calibration mode 82, IF switches 76-0, 76-1, and 76-2 may be open. Inter-mixer switches 74-0, 74-1, and 74-2 may be closed. Switches 90, 84, and 86 in adjustable load 50 may be open. This may configure mixer array 46 to form a phase detector and may configure adjustable load 50 to form a DC amplifier.

For example, mixer circuit 70-0 may have a first input that receives LO phase LO1 from phase path 44-1 via inter-mixer path 72-0, inter-mixer switch 74-0, and input path 78-0. Mixer circuit 70-0 may have a second input that receives LO phase LO0 over phase path 44-0. Similarly, mixer circuit 70-1 may have a first input that receives LO phase LO2 from phase path 44-2 via inter-mixer path 72-1, inter-mixer switch 74-1, and input path 78-1. Mixer circuit 70-1 may have a second input that receives LO phase LO1 over phase path 44-1. At the same time, mixer circuit 70-2 may have a first input that receives LO phase LO0 from phase path 44-0 via inter-mixer path 72-2, inter-mixer switch 74-2, and input path 78-2. Mixer circuit 70-2 may have a second input that receives LO phase LO2 over phase path 44-2.

Inter-mixer path 72-0 may impart a routing phase delay $\delta$ to LO phase LO1 by the time LO phase LO1 is received at mixer circuit 70-0. Inter-mixer path 72-1 may also impart routing phase delay $\delta$ to LO phase LO2 by the time LO phase LO2 is received at mixer circuit 70-1. Likewise, inter-mixer path 72-2 may impart routing phase delay $\delta$ to LO phase LO0 by the time LO phase LO0 is received at mixer circuit 70-2. In other words, routing phase delay $\delta$ may be the routing delay associated with the inter-mixer paths 72 in mixer array 46. Mixer circuits 70 may mix each of the LO phases together to produce a DC voltage $V_{DC}$ across differential output lines 48P/48N (e.g., output signals RFOUT of FIG. 2 may be DC voltage $V_{DC}$ in calibration mode 82). DC voltage $V_{DC}$ is described mathematically by equation 1.

$$V_{DC}=(\cos(\alpha+\delta)-2\cos(\alpha+\delta)+\cos(2\alpha+\delta))\times \text{GAIN} \quad (1)$$

In equation 1, GAIN is the gain imparted by adjustable load 50. For example, in calibration mode 82, inductors L1 and L2 and form a short circuit for the DC voltage and power supply voltage $V_{DD}$ may be decoupled from circuit node 88. This may configure adjustable load 50 to form a differential amplifier that applies gain GAIN to DC voltage $V_{DC}$. The gain of the differential amplifier may be provided by transistors 94 and 98 and resistors R1 and R2. The amplified DC voltage $V_{DC}$ carries information identifying routing phase delay $\delta$ and phase delay $\alpha$ (e.g., as given by equation 1) and may be passed to the first and second inputs of an ADC such as comparator 100. Comparator 100 may convert DC voltage $V_{DC}$ into digital output DO at output terminal 102 (e.g., control path 56 of FIG. 2). Digital output DO may identify routing phase delay $\delta$ and/or phase delay $\alpha$. The example of FIG. 5 in which a comparator produces digital output DO is merely illustrative and, in general, comparator 100 may be replaced by any desired ADC circuitry.

Controller 54 (FIG. 2) may process digital output DO to calibrate harmonic rejection mixer 38. For example, controller 54 may gather digital outputs DO as controller 54 sweeps through different phase codes that are used by programmable delay line 42 to produce LO phases LOi. Controller 54 may process the gathered digital outputs DO to identify a zero crossing point of DC voltage $V_{DC}$ as a function of phase delay $\alpha$. Assuming a routing phase delay $\delta$ of zero for now, the zero crossing point may be simplified from equation 1 and defined by equation 2 (the effects of non-zero routing phase delays $\delta$ will be described shortly).

$$2\cos^2(\alpha)-\cos(\alpha)-1=0 \quad (2)$$

The zero crossing point may, for example, be found by solving equation 2 for phase delay $\alpha$. Three solutions (zero crossing points) for equation 2 may be found: a first solution at 0 degrees, a second solution at 120 degrees, and a third solution at 240 degrees. The second solution at 120 degrees may exhibit asymmetry and poor linear range for different routing phase delays $\delta$. At the same time, the third solution at 240 degrees may exhibit larger linear range for a relatively large range of routing phase delays $\delta$ (e.g., equation 2 may resemble a line at the zero crossing point at 240 degrees with a relatively constant slope for a large range of routing phase delays such as routing phase delays δ from 0 degrees to as high as 50 degrees or more). In general, either the second or third solutions (e.g., the second or third zero crossing points) may be used to perform harmonic rejection calibration (e.g., for identifying an optimal phase code for the programmable delay line).

Figure 6:
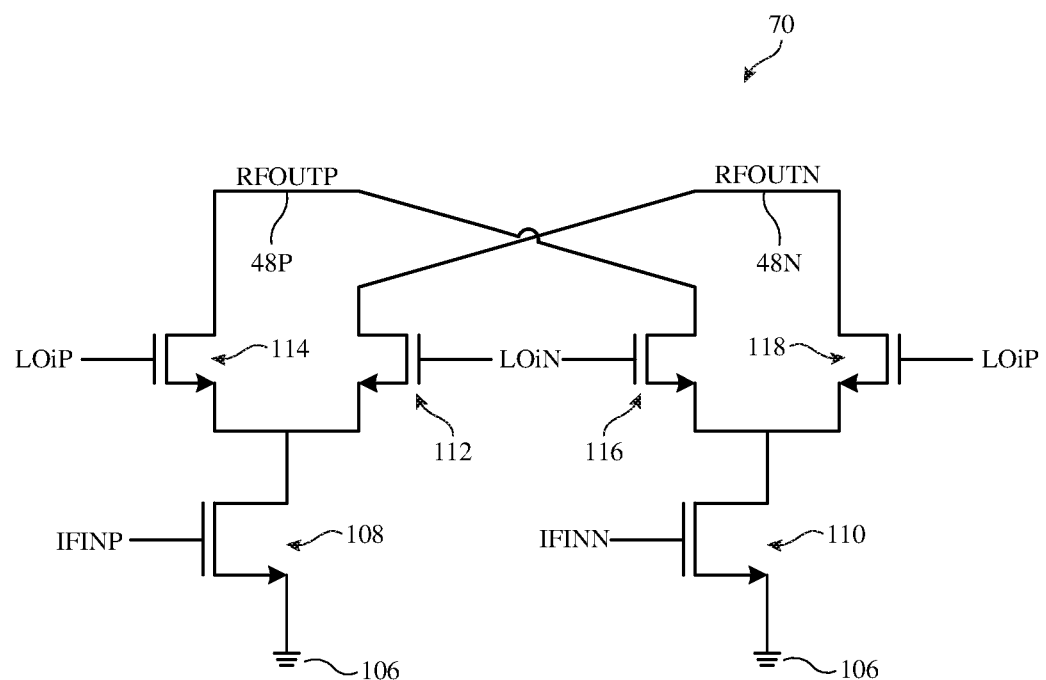
FIG. 6 is a circuit diagram of an illustrative mixer circuit that may be used in a harmonic rejection mixer in accordance with some embodiments.

FIG. 6 is a circuit diagram of an illustrative mixer circuit 70 that may to form any of the N mixer circuits in mixer array 46. As shown in FIG. 6, mixer circuit 70 may include a first transistor 108, a second transistor 114, a third transistor 112, a fourth transistor 116, a fifth transistor 110, and a sixth transistor 118. Transistors 108, 114, 112, 116, 110, and 118 may be NMOS transistors, as an example. The source terminal of transistor 108 may be coupled to reference voltage 106 (e.g., ground). The source terminal of transistor 110 may also be coupled to reference voltage 106.

The drain terminal of transistor 108 may be coupled to the source terminals of transistors 114 and 112. The drain terminal of transistor 110 may be coupled to the source terminals of transistors 116 and 118. The drain terminals of transistors 114 and 116 may be coupled to differential output line 48P. The drain terminals of transistors 112 and 118 may be coupled to differential output line 48N. The gate terminal of transistor 108 may receive differential IF signals IFINP. The gate terminal of transistor 110 may receive differential IF signals IFINN. In the differential signal example of FIG. 6, the LO phases LOi produced by the programmable delay line may include a differential pair of LO phases LOiP/LOiN. The gate terminals of transistors 114 and 118 may receive differential LO phases LOiP. The gate terminals of transistors 112 and 116 may receive differential LO phases LOiN. Mixer circuit 70 may mix differential IF signal pair IFINP/IFINN using the differential pair of LO phases LOiP/LOiN to produce differential output signal RFOUTP on differential output line 48P and to produce differential output signal RFOUTN on differential output line 48N. The example of FIG. 6 is merely illustrative. Mixer circuit 70 may be implemented using other architectures and/or may operate on single-ended signals if desired. The connections of differential output lines 48P and 48N as shown in FIG. 6 may be swapped to invert the output of the mixer circuit if desired (e.g., for forming mixer circuits 70-0 and 70-3 of FIGS. 5 and 6).

Figure 7:
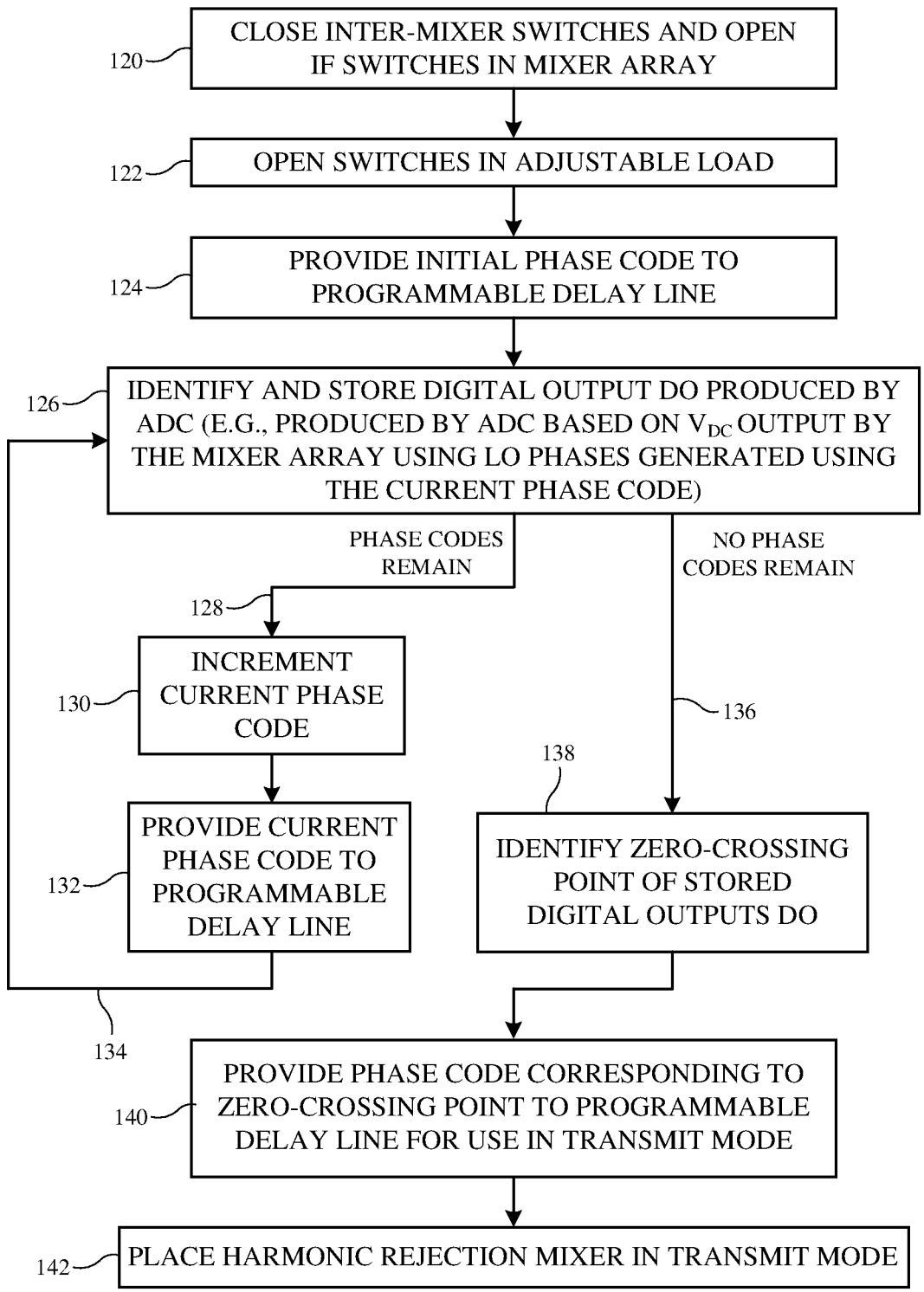
FIG. 7 is a flow chart of illustrative steps involved in calibrating the phase code for a harmonic rejection mixer in accordance with some embodiments.

FIG. 7 is a flow chart of illustrative steps that may be performed by controller 54 in calibrating harmonic rejection mixer 38 based on digital output DO from adjustable load 50. The steps of FIG. 7 may, for example, be performed by controller 54 while harmonic rejection mixer 38 is in calibration mode 82 of FIG. 3 (e.g., while harmonic rejection mixer 38 is configured as shown in the circuit diagram of FIG. 5).

At step 120, controller 54 may close inter-mixer switches 74 in mixer array 46 (e.g., using control signals CTRL2 of FIG. 2).

At step 122, controller 54 may open IF switches 76 in mixer array 46 (e.g., using control signals CTRL2 of FIG. 2). Controller 54 may subsequently begin to control programmable delay line 42 to sweep through different LO phases LOi that are provided to mixer array 46. For example, controller 54 may begin to sweep through different phase codes for programmable delay line 42.

At step 124, to begin sweeping through phase codes, controller 54 may provide an initial phase code to programmable delay line 42 (e.g., using control signals CTRL3 provided over control path 60 of FIG. 2). The initial phase code may configure adjustable capacitances 68 to exhibit a corresponding capacitance, thereby configuring each delay cell 62 in programmable delay line 42 to introduce a corresponding phase delay α in producing LO phases LOi based on LO waveforms LOC.

Mixer array 46 may receive the LO phases LOi produced by programmable delay line 42 using the initial phase code. Mixer array 46 may produce a corresponding DC voltage $V_{DC}$ on output path 48. DC voltage $V_{DC}$ may identify the routing phase delay δ produced by the inter-mixer paths 72 in mixer array 46 and/or the phase delay α of the programmable delay line. Comparator 100 may produce digital output DO using DC voltage $V_{DC}$. Digital output DO may, for example, be a digital version of DC voltage $V_{DC}$.

At step 126, controller 54 may identify and store digital output DO for further processing. The stored digital output DO may, for example, identify a corresponding routing phase delay δ and/or phase delay α (e.g., as given by equation 1).

If phase codes in the sweep remain for processing (e.g., phase codes from all of the possible phase codes for adjustable capacitances 68 of FIG. 1), processing may proceed to step 130 as shown by arrow 128. At step 130, controller 54 may increment the current phase code (e.g., controller 54 may identify the next phase code to use in the sweep of phase codes).

At step 132, controller 54 may provide the current phase code (e.g., as identified set during processing of step 130) to programmable delay line 42. The current phase code may configure adjustable capacitances 68 to exhibit a different capacitance, thereby configuring each delay cell 62 in programmable delay line 42 to introduce a different corresponding phase delay α in producing LO phases LOi based on LO waveforms LOC. Processing may then loop back to step 126, as shown by arrow 134. Controller 54 may then continue to gather and store the digital outputs DO produced by adjustable load 50 for each of the phase codes in the sweep.

When no phase codes remain in the sweep for processing, processing may proceed to step 138 as shown by arrow 136. At step 138, controller 54 may process the digital outputs DO stored during each iteration of step 126 (e.g., the digital outputs DO produced using each phase code in the sweep of phase codes) to identify a zero-crossing point of the stored digital outputs DO. As an example, the stored digital outputs DO may include a sinusoidal curve that plots DC voltage $V_{DC}$ (e.g., a digital version of the magnitude of DC voltage $V_{DC}$) as a function of phase delay α. Controller 54 may have information that identifies which phase code produced each phase delay α of the curve. This curve may have a first zero crossing point at zero degrees, a second zero crossing point at 180 degrees, and a third zero crossing point at 240 degrees, for example. Controller 54 may identify the second or the third zero crossing point as the zero crossing point to use for subsequent processing.

At step 140, controller 54 may provide the phase code that produced the phase delay α corresponding to the identified zero crossing point (e.g., at 180 or 240 degrees) to programmable delay line 42. This phase code may be used to set adjustable capacitances 68 to exhibit a selected (e.g., calibrated) capacitance. Programable delay line 42 may use the selected capacitance in producing calibrated LO phases LOi.

At step 142, controller 54 may place harmonic rejection mixer 38 back into transmit mode 80 (FIG. 3). Harmonic rejection mixer 38 may produce output signals RFOUT at radio frequencies based on the calibrated LO phases LOi produced by programmable delay line 42 using the selected capacitance. Performing up-conversion using calibrated LO phases LOi may allow harmonic rejection mixer 38 to mitigate odd-order harmonic interference in the radio-frequency signals transmitted by antenna(s) 30 given the present operating conditions at device 10. In this way, controller 54 may periodically or occasionally calibrate the operation of harmonic rejection mixer 38 so the harmonic rejection mixer can minimize EVM and spectral regrowth in the radio-frequency signals even as device temperature, operating frequency, or other device conditions change over time.

Figure 8:
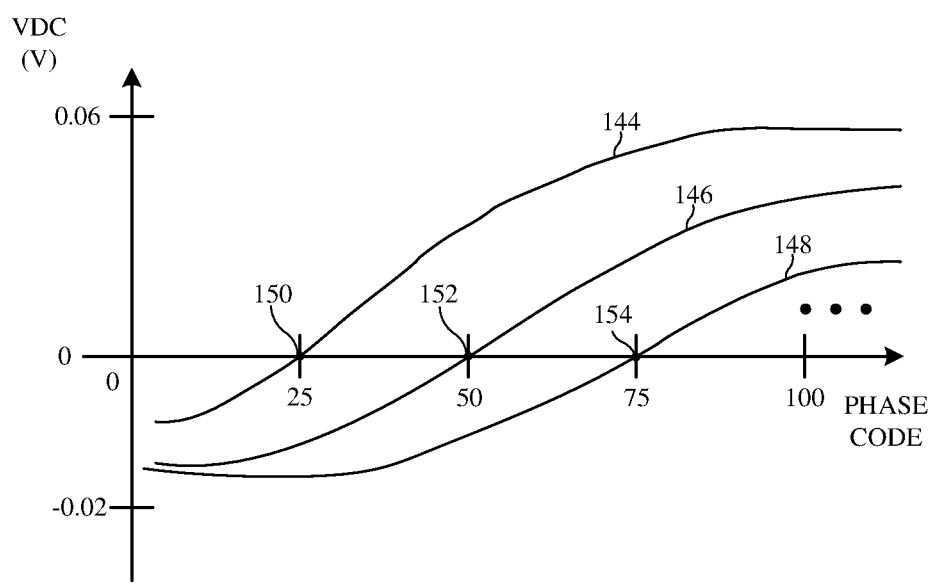
FIG. 8 is a plot illustrating how a zero-crossing point may be identified while calibrating the phase code for a harmonic rejection mixer in accordance with some embodiments.

In general, different zero-crossing points may be produced as the frequency of the radio-frequency signals changes over time. FIG. 8 is a plot showing how different frequencies may produce different zero-crossing points that are used for calibrating harmonic rejection mixer 38. More particularly, FIG. 8 plots the DC voltage $V_{DC}$ produced by mixer array 46 and adjustable load 50 (e.g., as identified by the digital outputs DO stored by controller 54 at each iteration of step 126 of FIG. 7) as a function of the phase code from the phase code sweep that produced the DC voltage $V_{DC}$. Phase code is plotted on the horizontal axis as a phase code index, where each phase code index corresponds to a respective phase code from the sweep of phase codes performed while processing the steps of FIG. 7 (e.g., a phase code of "25" represents the 25$^{th}$ phase code from the sweep, a phase code of "50" represents the 50$^{th}$ phase code from the sweep, etc.).

Curve 144 plots the DC voltage $V_{DC}$ produced using a first frequency channel, curve 146 plots the DC voltage $V_{DC}$ produced using a second frequency channel, and curve 148 plots the DC voltage $V_{DC}$ produced using a third frequency channel. Curves 144, 146, and 148 are shown as only having a single zero crossing point in FIG. 8 for the sake of clarity (e.g., the 180 degree or 240 degree zero crossing point). As shown by curves 144, 146, and 148, the particular frequency channel that is used will change the zero crossing point of DC voltage $V_{DC}$.

In scenarios where curve 144 is produced, controller 54 may identify the corresponding zero crossing point 150 of DC voltage $V_{DC}$ (e.g., the point where curve 150 crosses a voltage of zero). Controller 54 may use the phase code corresponding to zero crossing point 150 to configure the adjustable capacitances 68 in programmable delay line 42. For example, as shown in FIG. 8, controller 54 may use the 25$^{th}$ phase code from the sweep to configure the adjustable capacitances 68 in programmable delay line 42. This may configure programmable delay line 42 to generate the optimal LO phases LOi for mitigating harmonic interference while operating using the first frequency channel.

Similarly, in scenarios where curve 146 is produced, controller 54 may identify the corresponding zero crossing point 152 of DC voltage $V_{DC}$ (e.g., the point where curve 146 crosses a voltage of zero). Controller 54 may use the phase code corresponding to zero crossing point 152 to configure the adjustable capacitances 68 in programmable delay line 42. For example, as shown in FIG. 8, controller 54 may use the 50$^{th}$ phase code from the sweep to configure the adjustable capacitances 68 in programmable delay line 42. This may configure programmable delay line 42 to generate the optimal LO phases LOi for mitigating harmonic interference while operating using the second frequency channel.

Likewise, in scenarios where curve 148 is produced, controller 54 may identify the corresponding zero crossing point 154 of DC voltage $V_{DC}$ (e.g., the point where curve 148 crosses a voltage of zero). Controller 54 may use the phase code corresponding to zero crossing point 154 to configure the adjustable capacitances 68 in programmable delay line 42. For example, as shown in FIG. 8, controller 54 may use the 75$^{th}$ phase code from the sweep to configure the adjustable capacitances 68 in programmable delay line 42. This may configure programmable delay line 42 to generate the optimal LO phases LOi for mitigating harmonic interference while operating using the third frequency channel.

The example of FIG. 8 is merely illustrative. In practice, curves 144-148 may have other shapes. While FIG. 8 illustrates how different zero crossing points and thus different optimal phase codes may be identified as operating frequency changes, the process of FIG. 7 may be used to identify the optimal phase code as device temperature changes over time, as frequency changes, and/or as any other operating conditions change over time. This may serve to reduce the interference effects of harmonics of the LO on the radio-frequency signals output by transmitter 28 (e.g., radio-frequency signals RF' of FIG. 1) by as much as 10 dB or more, thereby optimizing the radio-frequency performance of device 10. While the examples of FIGS. 1-8 describe harmonic rejection mixer 38 as being formed in a wireless transmitter such as transmitter 28, harmonic rejection mixer 38 may additionally or alternatively be formed in a wireless receiver (e.g., for performing harmonic rejection operations on signals received by antenna(s) 30).

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

What is claimed is:

1. An electronic device comprising:
   a mixer array configured to upconvert input signals on an input path to produce radio-frequency signals on an output path, the mixer array having
      a first mixer circuit with a first input configured to receive a first local oscillator (LO) phase, a second input configured to receive the input signals, and a first output coupled to the output path,
      a second mixer circuit with a third input configured to receive a second LO phase that is phase-delayed with respect to the first LO phase, a fourth input configured to receive the input signals, and a second output coupled to the output path, and
      an inter-mixer switch coupled between the second input of the first mixer circuit and the third input of the second mixer circuit.

2. The electronic device of claim 1, wherein the mixer array comprises:
   a third mixer circuit having a fifth input configured to receive a third LO phase that is phase-delayed with respect to the first and second LO phases, a sixth input configured to receive the input signals, and a third output coupled to the output path; and
   an additional inter-mixer switch coupled between the fourth input of the second mixer circuit and the fifth input of the third mixer circuit.

3. The electronic device of claim 1, further comprising:
   a local oscillator generator configured to generate LO waveforms; and a programmable delay line having cascaded first and second delay cells, the first delay cell being configured to generate the first LO phase based on the LO waveforms and the second delay cell being configured to generate the second LO phase based on an output of the first delay cell.

4. The electronic device of claim 3, wherein the first delay cell comprises:
a first inverter having an input configured to receive the LO waveforms and having an output coupled to the second delay cell; and
a second inverter having an input coupled to the output of the first inverter and having an output coupled to the first input of the first mixer circuit.

5. The electronic device of claim 4, wherein the second delay cell comprises:
a third inverter having an input coupled to the output of the first inverter; and
a fourth inverter having an input coupled to an output of the third inverter and having an output coupled to the third input of the second mixer circuit.

6. The electronic device of claim 5, wherein the first delay cell has a first adjustable capacitance coupled between the output of the first inverter and a control line and the second delay cell has a second adjustable capacitance coupled between the output of the third inverter and the control line.

7. The electronic device of claim 6, further comprising:
a controller coupled to the control line, the controller being configured to provide a phase code to the first and second adjustable capacitances that configures the first and second adjustable capacitances to exhibit a selected capacitance.

8. The electronic device of claim 7, further comprising:
a first switch coupled between the input path and the second input of the first mixer circuit;
a second switch coupled between the input path and the fourth input of the second mixer circuit, the mixer array being configured to generate the radio-frequency signals on the output path while the first and second switches are closed and the first and second inter-mixer switches are open; and
an analog-to-digital converter (ADC) coupled between the output path and the controller, wherein the mixer array is configured to generate a direct current (DC) voltage on the output path while the first and second inter-mixer switches are closed and the first and second switches are open, the ADC being configured to generate a digital output based on the DC voltage and the controller being configured to calibrate the phase code based on the digital output.

9. The electronic device of claim 8, wherein the controller is configured to sweep the phase code provided to the first and second adjustable capacitances while storing the digital output generated by the ADC and is configured to provide a calibrated phase code to the first and second adjustable capacitances, the calibrated phase code corresponding to a zero-crossing point of the DC voltage as identified by the stored digital output.

10. The electronic device of claim 1, wherein the mixer array comprises:
a first switch coupled between the second input of the first mixer circuit and the input path; and
a second switch coupled between the fourth input of the second mixer circuit and the input path.

11. The electronic device of claim 1, wherein the output path comprises first and second differential output lines, the electronic device further comprising:

a first inductor and a first switch coupled in series between the first differential output line and a circuit node;
a first resistor coupled in parallel with the first switch between the first inductor and the circuit node;
a second inductor and a second switch coupled in series between the second differential output line and the circuit node;
a second resistor coupled in parallel with the second switch between the second inductor and the circuit node;
a third switch that couples the circuit node to a power supply terminal;
a first transistor coupled between the first differential output line and the power supply terminal, the first transistor having a first gate terminal coupled to the circuit node; and
a second transistor coupled between the second differential output line and the power supply terminal, the second transistor having a second gate terminal coupled to the circuit node.

12. The electronic device of claim 11, further comprising:
an analog-to-digital converter (ADC) coupled to the first and second differential output lines; and
a controller coupled to an output of the ADC, the controller being configured to operate the electronic device in a transmit mode and in a calibration mode, the mixer array being configured generate the radio-frequency signals in the transmit mode, the mixer array being configured to generate a direct current (DC) voltage across the first and second differential output lines in the calibration mode, and the ADC being configured to generate a digital output based on the DC voltage in the calibration mode.

13. A method of operating mixer circuitry comprising:
with a programmable delay line, generating a first local oscillator (LO) phase, a second LO phase, and a third LO phase, the second LO phase being phase-delayed with respect to the first LO phase, and the third LO phase being phase-delayed with respect to the second LO phase;
with a first mixer circuit in a mixer array, mixing the first LO phase with the second LO phase;
with a second mixer circuit in the mixer array, mixing the second LO phase with the third LO phase;
with the mixer array, outputting a direct current (DC) voltage onto an output path, the DC voltage being produced by at least the first and second mixer circuits;
with an adjustable load coupled to the output path, amplifying the DC voltage to generate an amplified DC voltage;
with an analog-to-digital converter (ADC) coupled to the output path, generating a digital output based on the amplified DC voltage; and
with a controller coupled to the ADC, adjusting the first, second, and third LO phases based on the digital output.

14. The method of claim 13, further comprising:
with the controller, providing a phase code to the programmable delay line that configures the programmable delay line to exhibit a selected capacitance; and
with the controller, adjusting the phase code based on the digital output.

15. The method of claim 14, further comprising:
with the controller, sweeping the phase code over a set of phase codes;

with the controller, storing the digital output generated by the ADC for each of the phase codes in the set of phase codes;

with the controller, identifying a zero crossing point of the DC voltage based on the stored digital output; and with the controller, providing a calibrated phase code associated with the zero crossing point to the programmable delay line.

16. The method of claim 15, further comprising:

with the programmable delay line, generating a first calibrated LO phase and a second calibrated LO phase using the calibrated phase code;

with the first mixer circuit, mixing the first calibrated LO phase with an input signal;

with the second mixer circuit, mixing the second calibrated LO phase with the input signal;

with the mixer array, outputting radio-frequency signals onto the output path, the radio-frequency signals being produced by at least the first and second mixer circuits;

with the adjustable load, amplifying the radio-frequency signals to produce amplified radio-frequency signals; and with an antenna, transmitting the amplified radio-frequency signals.

17. An electronic device comprising:

an input path configured to receive input signals;

first and second output lines;

a programmable delay line configured to generate a set of local oscillator (LO) phases;

a mixer array coupled between the input path and the first and second output lines, the mixer array being configured to generate radio-frequency signals on the first and second output lines based on the input signals and the set of LO phases; and an adjustable load coupled to the first and second output lines.

18. The electronic device of claim 17, wherein the adjustable load comprises:

a first inductor coupled to the first output line;

a first switch coupled in series between the first inductor and a circuit node;

a second inductor coupled to the second output line;

a second switch coupled in series between the second inductor and the circuit node;

a power supply terminal; and a third switch coupled between the power supply terminal and the circuit node.

19. The electronic device of claim 18, wherein the adjustable load comprises:

a first transistor coupled between the first output line and the power supply terminal, the first transistor having a first gate terminal coupled to the circuit node, a second transistor coupled between the second output line and the power supply terminal, the second transistor having a second gate terminal coupled to the circuit node, a first resistor coupled between the first inductor and the circuit node in parallel with the first switch, and a second resistor coupled between the second inductor and the circuit node in parallel with the second switch.

20. The electronic device of claim 18, comprising:

a controller configured to operate the electronic device in a transmit mode and in a calibration mode, wherein the mixer array is configured to output the radio-frequency signals on the first and second output lines in the transmit mode, the mixer array is configured to output a direct-current (DC) voltage on the first and second output lines in the calibration mode, the controller is configured to open the first, second, and third switches in the calibration mode, and the controller is configured to close the first, second, and third switches in the transmit mode; and an analog-to-digital converter (ADC) coupled to the first and second output lines, the ADC being configured to generate a digital output based on the DC voltage in the calibration mode, and the controller being configured to adjust the set of LO phases produced by the programmable delay line based on the digital output in the calibration mode.

* * * * *